(12) United States Patent
Asano et al.

(10) Patent No.: US 9,769,927 B2
(45) Date of Patent: Sep. 19, 2017

(54) STRUCTURAL BODY AND METHOD FOR MANUFACTURING SAME

(71) Applicant: DAI NIPPON PRINTING CO., LTD., Tokyo (JP)

(72) Inventors: Masaaki Asano, Tokyo (JP); Hiroshi Mawatari, Tokyo (JP); Takafumi Okamura, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/452,828

(22) Filed: Mar. 8, 2017

(65) Prior Publication Data

US 2017/0181280 A1    Jun. 22, 2017

Related U.S. Application Data

(63) Continuation of application No. PCT/JP2015/074853, filed on Sep. 1, 2015.

(30) Foreign Application Priority Data

Sep. 9, 2014    (JP) .................................. 2014-183400

(51) Int. Cl.
*H05K 1/11*    (2006.01)
*H05K 3/40*    (2006.01)
(Continued)

(52) U.S. Cl.
CPC ............ *H05K 1/115* (2013.01); *H01L 21/486* (2013.01); *H01L 22/32* (2013.01);
(Continued)

(58) Field of Classification Search
CPC ........ H05K 1/112; H05K 1/113; H05K 1/114; H05K 1/115; H05K 1/116; H05K 3/4038
(Continued)

(56) References Cited

U.S. PATENT DOCUMENTS 6,723,927 B1 * 4/2004 Fan ................... H01L 23/49827
174/262
8,552,548 B1    10/2013 Do et al.
(Continued)

FOREIGN PATENT DOCUMENTS

JP    2000-252599 A    9/2000
JP    2002-26520 A    1/2002
(Continued)

OTHER PUBLICATIONS

International Search Report for PCT/JP2015/074853, mailed on Dec. 1, 2015.
(Continued)

*Primary Examiner* — Sherman Ng
(74) *Attorney, Agent, or Firm* — Typha IP LLC (57) ABSTRACT

The structural body related to the present disclosure includes a substrate having insulation properties arranged with a first surface and a second surface opposing the first surface, a through hole passing through the first surface and the second surface of the substrate, and a through electrode including a conductive material arranged within the through hole, the through electrode conducting the first surface and the second surface of the substrate and including a projection part exposed from the second surface to the outside of the through hole, wherein at least a part of the through hole is gradually increasing in size approaching the second surface in a thickness direction of the substrate, and forming a depression part keeping a gap between the through hole and the through electrode.

18 Claims, 11 Drawing Sheets

(51) Int. Cl.
H01L 23/498 (2006.01)
H01L 21/66 (2006.01)
H01L 21/48 (2006.01)
H01L 25/065 (2006.01)

(52) U.S. Cl.
CPC .. H01L 23/49827 (2013.01); H01L 23/49838 (2013.01); H01L 23/49883 (2013.01); H01L 25/0657 (2013.01); H05K 3/4038 (2013.01); H01L 2225/06548 (2013.01)

(58) Field of Classification Search
USPC .................................. 174/262–267
See application file for complete search history.

(56) References Cited

U.S. PATENT DOCUMENTS

| | | |
|---|---|---|
| 2004/0137705 A1 | 7/2004 | Nemoto et al. |
| 2006/0001090 A1 | 1/2006 | Kawano et al. |
| 2010/0164120 A1 | 7/2010 | Nakayama et al. |
| 2012/0118621 A1* | 5/2012 | Choi ............... H05K 3/4015 174/258 |
| 2012/0231303 A1* | 9/2012 | Kim ................ H01M 2/1066 429/7 |
| 2014/0054075 A1* | 2/2014 | Hu ................. H05K 3/3452 174/257 |

FOREIGN PATENT DOCUMENTS

| | | |
|---|---|---|
| JP | 2004-221240 A | 8/2004 |
| JP | 2006-19424 A | 1/2006 |
| JP | 2010-171377 A | 8/2010 |
| JP | 2012-29166 A | 2/2012 |
| JP | 2014-236131 A | 12/2014 |

OTHER PUBLICATIONS

Written Opinion of the International Search Authority for PCT/JP2015/074853, mailed on Dec. 1, 2015.
English Translation of the Written Opinion of the International Search Authority for PCT/JP2015/074853, which was originally dated Dec. 1, 2015, was previously submitted on Mar. 8, 2017.

* cited by examiner

STRUCTURAL BODY AND METHOD FOR MANUFACTURING SAME

CROSS REFERENCE TO RELATED APPLICATIONS

This application is based upon and claims the benefit of priority from the prior Japanese Patent Application No. 2014-183400, filed on Sep. 9, 2014, and PCT Application No. PCT/JP2015/074853 filed on Sep. 1, 2015, the entire contents of which are incorporated herein by reference.

FIELD

The embodiments of the present disclosure are related to a structural body and a method of manufacturing the same. In particular, the embodiments of the present disclosure are related to a conductive material filled through hole substrate formed with a through hole passing through the top surface and rear surface of a substrate and a conductive material filled into the through hole and a method of manufacturing the same.

BACKGROUND

In recent years, high densification and miniaturization of electronic devices is progressing, LSI chips are being reduced in size to the same extent as semiconductor packages, and the high densification due to two-dimensional arrangement of chips within a package continues to reach its limit. Thus, it is necessary to separate and stack LSI chips in three-dimensions in order to increase the mounting density of chips within a package. In addition, it is necessary to bring the distance between stacked circuits closer together in order to operate the entire semiconductor package stacked with LSI chips at high speed.

Therefore, in order to respond to the demands described above, a through electrode substrate has been proposed arranged with a conductive part (through hole) which conducts the front surface and rear surface of a substrate as an interposer between LSI chips. Such a through electrode substrate is formed with a through electrode by filling a conductive material (Cu etc.) into a through hole by electrolytic plating and the like.

However, in a conventional through electrode substrate, a blow-off phenomenon of a wiring layer in an annealing process during manufacturing and a phenomenon in which boosts, peelings or cracks occur in an insulation layer and the like within a through hole have been confirmed. The cause of these phenomena is due to the expansion of a gas component or water component included in a conductive material during a heat treatment.

SUMMARY

A structural body related to one embodiment of the present disclosure includes a substrate having insulation properties arranged with a first surface and a second surface opposing the first surface, a through hole passing through the first surface and the second surface of the substrate, and a through electrode including a conductive material arranged within the through hole, the through electrode conducting the first surface and the second surface of the substrate and including a projection part exposed from the second surface to the outside of the through hole, wherein at least a part of the through hole is gradually increasing in the hole size approaching the second surface in a thickness direction of the substrate, and forming a depression part keeping a gap between the through hole and the through electrode.

In addition, in another preferred aspect, a gas discharge part may be arranged to fill the gap and contact the projection part, the gas discharge part discharging gas discharged from the interior of the through electrode to the exterior.

In addition, in another preferred aspect, a ground conductive layer may be arranged on an inner wall of the through hole and including a conductive material, the gas discharge part covering a part of a boundary between the ground conductive layer and the through electrode at the second surface, and covering a smaller area than an area of the through electrode exposed above the second surface.

In addition, the gas discharge part may include an insulation material.

In addition, the gas discharge part may include an insulation resin.

In addition, the gas discharge part may include a polyimide resin.

In addition, in another preferred aspect, the structural body related to one embodiment of the present disclosure may include a column shaped conductive member filling the gap, protruding from the second surface, and covering a region of the through electrode exposed above the second surface.

A manufacturing method of a structural body related to one embodiment of the present disclosure includes forming a hole having one side open in a first surface of a substrate having insulation properties arranged with a second surface opposing the first surface, forming a through electrode including a conductive material within the hole, the through electrode conducting the first surface and the second surface, and performing a thinning process from the second surface side to expose a projection part of the through electrode from the second surface, wherein performing a thinning process includes a step at least a part of the hole gradually increasing in the hole size approaching the second surface in a thickness direction of the substrate, and forming a depression part keeping a gap between the hole and the through electrode.

In addition, in another preferred aspect, a gas discharge part may be arranged to fill the gap and contact the projection part, the gas discharge part discharging gas discharged from the interior of the through electrode to the exterior.

In addition, in another preferred aspect, a ground conductive layer may be arranged on an inner wall of the through hole and including a conductive material, the gas discharge part covering a part of a boundary between the ground conductive layer and the through electrode at the second surface, and covering a smaller area than an area of the through electrode exposed above the second surface.

In addition, the gas discharge part may include an insulation material.

In addition, the gas discharge part may include a polyimide resin.

In addition, in another preferred aspect, the manufacturing method of a structural body related to one embodiment of the present disclosure may include a column shaped conductive member filling the gap, protruding from the second surface, and covering a region of the through electrode exposed above the second surface.

DESCRIPTION OF EMBODIMENTS

The structures described in Japanese Laid Open Patent Publication No. 2002-26520 and Japanese Laid Open Patent Publication No. 2000-252599 for example have been proposed in order to suppress a blow-off phenomenon of a wiring layer or crack phenomenon of an insulation layer and the like which occur in an annealing process of the through electrode substrate described above. In a multi-layer wiring substrate described in Japanese Laid Open Patent Publication No. 2002-26520, an opening part formed to pass through vertically is arranged in a via island arranged directly above a via hole conductor filled with a conductive material, and a gas component or water component included in the conductive material during a heating treatment is discharged and prevented from expanding. In addition, a hole which links with an exterior atmosphere is arranged in a conductive film which covers a surface of a resin sealing member filled into a through hole in a printed substrate described in Japanese Laid Open Patent Publication No. 2000-252599, and gas which is discharged from the sealing member due to heating during reflow is discharged to the exterior atmosphere.

However, since it is necessary to further arrange an opening part which passes through vertically in a via island arranged directly above a via hole conductor in Japanese Laid Open Patent Publication No. 2002-26520, the manufacturing process becomes complex and fine processing is difficult. Similarly, since it is necessary to further arrange a hole which links with an exterior atmosphere in a conductive film which covers a surface of a resin sealing member filled into a through hole in Japanese Laid Open Patent Publication No. 2000-252599, the manufacturing process becomes complex and fine processing is difficult.

In addition, since there is a limit to the amount of gas component or water component included in a conductive material that is discharged to the exterior by the methods described in Japanese Laid Open Patent Publication No. 2002-26520 and Japanese Laid Open Patent Publication No. 2000-252599, a method is required which can effectively resolve a blow-off phenomenon of a wiring layer or crack phenomenon of an insulation layer and the like which occur in an annealing process of a through electrode substrate.

In view of the situation described above, the present disclosure aims to provide a structural body such as a conductive material filled through hole substrate which can more effectively discharge a gas component or water component which are produced from a conductive material at the time of a heat treatment to the exterior without complicating the manufacturing process.

According to the embodiments of the present disclosure, it is possible to provide a structural body such as a conductive material filled through hole substrate which can more effectively discharge a gas component or water component which are produced from a conductive material at the time of a heat treatment to the exterior without complicating the manufacturing process.

First Embodiment

A structural body related to a first embodiment of the present disclosure is explained in detail below while referring to FIG. 1A to FIG. 4D. The structural body is typically a conductive material filled through hole substrate in which a conductive material is filled into a though hole substrate, more specifically, a through electrode substrate such as an interposer or a structural body that is applied to a probe card and the like used in an examination of a semiconductor chip. The structural body related to the embodiments of the present disclosure is explained below using a conductive material filled through hole substrate as an example. Furthermore, the embodiments illustrated below are one example of the embodiments of the present disclosure and the present disclosure should not be interpreted as being limited to these embodiments. In addition, in the drawings which are referenced in the present embodiment, the same or similar reference symbols are attached to the same parts or parts which have similar functions and repeated explanations may be omitted. In addition, the dimension ratios in the drawings may be different from actual ratios for the purpose of explanation and parts of the structure may be omitted from the drawings.

[Structure of a Structural Body]

Figure 1A:
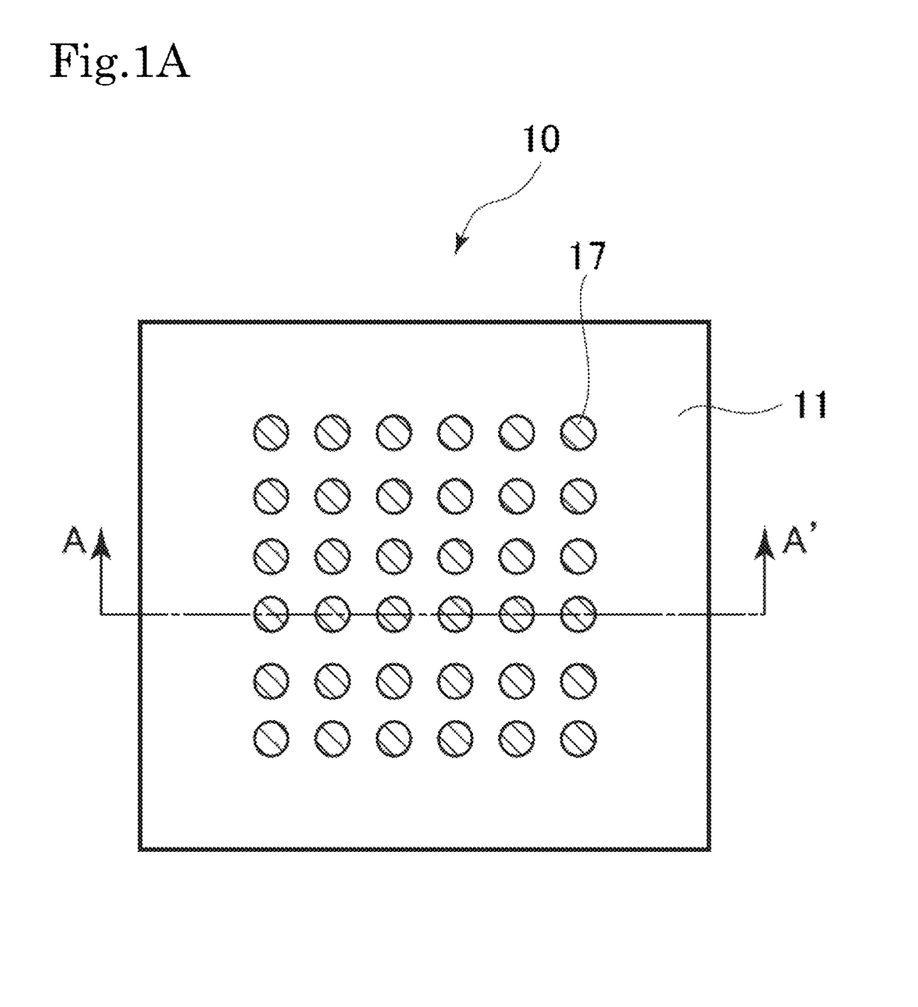
FIG. 1A is an upper surface view diagram of a conductive material filled through hole substrate related to a first embodiment of the present disclosure.
Figure 1B:
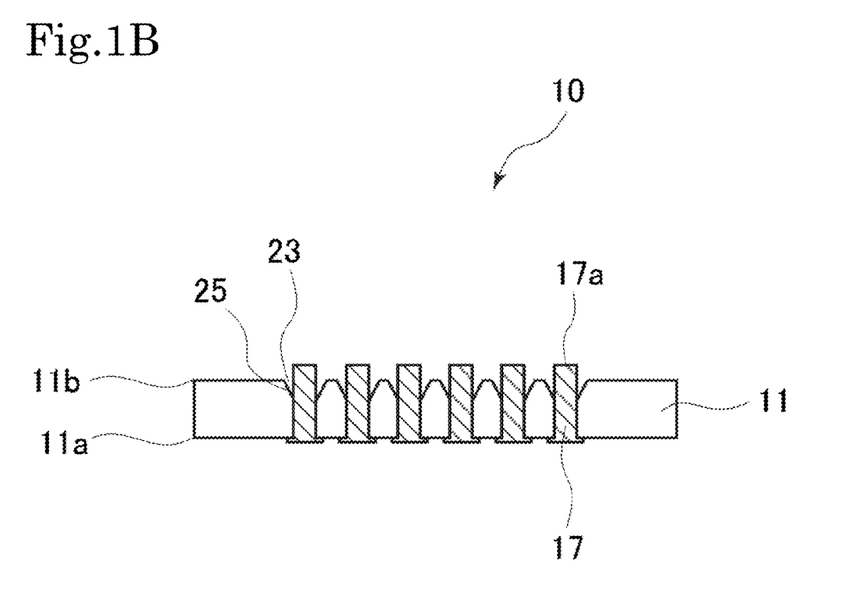
FIG. 1B is a cross-sectional diagram of a conductive material filled through hole substrate related to a first embodiment of the present disclosure.

FIG. 1A and FIG. 1B are an upper surface diagram and cross-sectional diagram of a conductive material filled through hole substrate which is the structural body related to the first embodiment of the present disclosure.

Referring to FIG. 1A and FIG. 1B, the conductive material filled through hole substrate 10 (see FIG. 4C) related to the first embodiment of the present disclosure includes a substrate (a glass substrate 11 for example) with insulation properties arranged with a first surface 11a and a second surface 11b, a through hole 13a which passes through the first surface 11a and second surface 11b, a ground conductive layer 15 arranged on an inner wall of the through hole 13a and including a conductive material which is arbitrarily arranged, and also includes a through electrode 17 including a metal material as an example of a conductive material and a projection part 17a exposed from the second surface 11b to the outside of the through hole 13a, arranged within the through hole 13a arranged with the ground conductive layer 15. The substrate with insulation properties may be any substrate as long as at least the top surface includes insulation properties. For the convenience of explanation, a glass substrate 11 which is an example of a substrate with insulation properties is explained herein.

Figure 2:
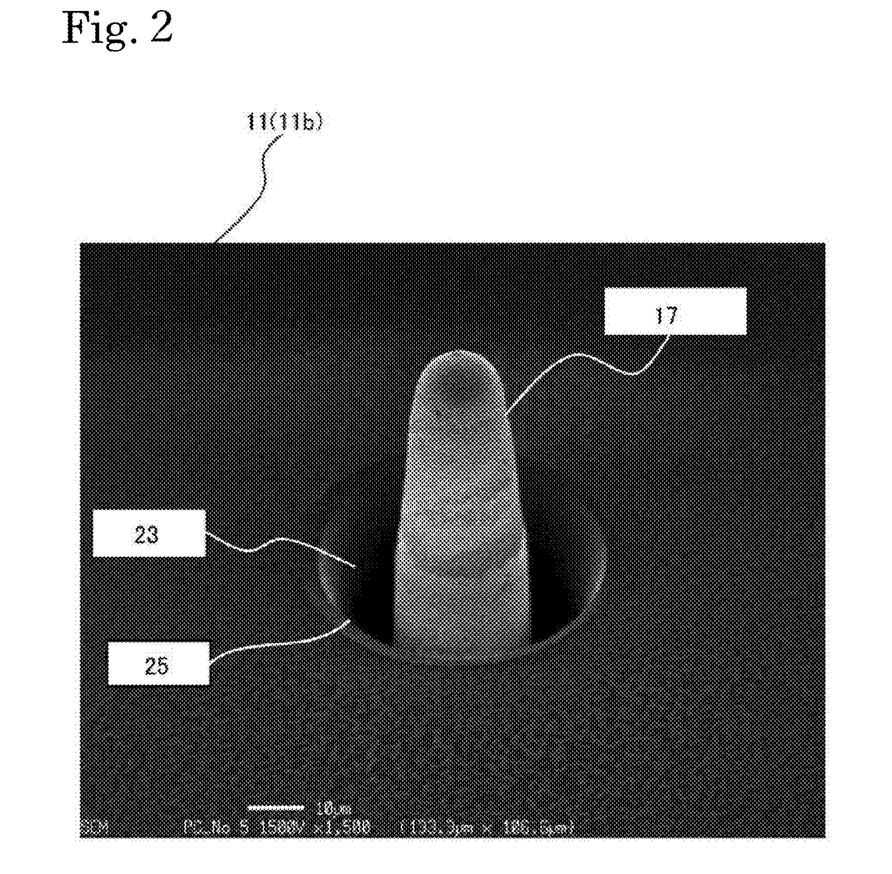
FIG. 2 is a SEM image of a conductive material filled through hole substrate related to a first embodiment of the present disclosure.
Figure 3:
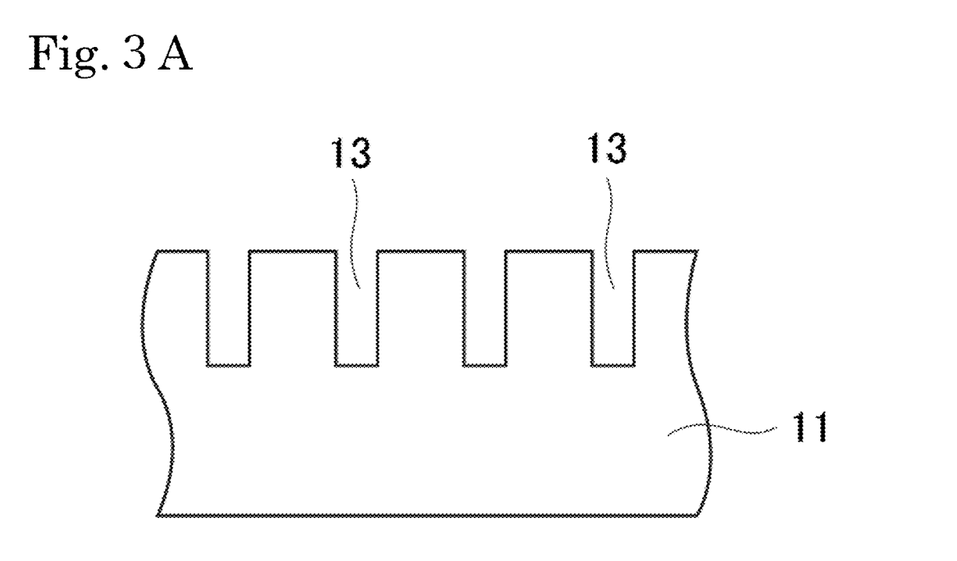
FIG. 3A is a process diagram showing a manufacturing method of a conductive material filled through hole substrate related to a first embodiment of the present disclosure.
FIG. 3B is a process diagram showing a manufacturing method of a conductive material filled through hole substrate related to a first embodiment of the present disclosure.
FIG. 3C is a process diagram showing a manufacturing method of a conductive material filled through hole substrate related to a first embodiment of the present disclosure.
FIG. 3D is a process diagram showing a manufacturing method of a conductive material filled through hole substrate related to a first embodiment of the present disclosure.

FIG. 2 is a SEM image seen from an upper diagonal direction of the second surface side of the conductive material filled through hole substrate related to the first embodiment of the present disclosure. As is shown in FIG. 2, on the second surface 11b side of the conductive material filled through hole substrate 10, the projection part 17a of the through electrode 17 projects from the second surface 11b and the through electrode 17 is arranged within a depression part 25 formed in the second surface 11b.

As is shown in FIG. 2, the depression part 25 may have a roughly conical shape the opening area of which gradually increases in size as it approaches the second surface 11b. The depression part 25 is formed in at least one part of the through hole 13a.

Since the structural body related to the present disclosure includes the depression part 25 in a periphery of the projection part 17a of the through electrode 17 and the depression part 25 keeps a gap between the through electrode 17, it is possible to effectively discharge a gas component or water component which are produced from a conductive material during a heat treatment to the exterior through this gap. This gas discharge effect is described in detail herein.

Furthermore, by providing the projection part 17a of the through electrode and the depression part 25 in a periphery therein, in the case where another component is formed above the through electrode 17, the other component is structurally stable and it is possible to prevent horizontal misalignment or desorption.

[Manufacturing Method of Structural Body]

A manufacturing method of a conductive material filled through hole substrate 10 which is the structural body related to the first embodiment of the present disclosure is explained below while referring to FIG. 3A to FIG. 4D. FIG. 3A to FIG. 4D are process diagrams showing a manufacturing method of a conductive material filled through hole substrate related to the first embodiment of the present disclosure.

First, a plurality of miniature holes 13 are formed in the first surface 11a of a glass substrate 11 (FIG. 3A). The following method is used for example as a specific method for forming the holes 13 in the glass substrate 11. First, a transformed part is formed in a part of the glass irradiated with a laser pulse by focusing a laser pulse with a wavelength A on a lens and irradiating the glass (first process). Second, the transformed part is etched using an etching solution with a larger etching rate with respect to the transformed part than an etching rate with respect to glass (second process).

According to this processing method, a transformed part different to glass before irradiation is formed in a part irradiated with a laser pulse. This transformed part undergoes a photochemical reaction due to laser irradiation, includes defects such as an E' center or non-bridging oxygen, and includes a coarse glass structure in a high temperature region which is produced by rapid heating and rapid cooling due to the laser irradiation. Since these transformed parts are easily etched with respect to certain etching solutions compared to normal parts, it is possible to form miniature holes or miniature grooves by immersing the transformed parts in an etching solution.

The laser pulse, wavelength and energy and the like used in the first process may be appropriately set according to the composition and absorption coefficient of the glass used in the glass substrate 11. In addition, the laser focal length and beam diameter of the laser used in the first process may be appropriately set according to the shape such as hole size of the miniature hole 13 and depth of the hole 13 to be formed.

In addition, the etching solution used in the second process can be appropriately selected as long as it is an etching solution with a larger etching rate with respect to a transformed part than an etching rate with respect to glass. The etching solution, etching time and etching solution temperature and the like may be appropriately selected according to the shape of the transformed part to be formed or the intended processing shape.

Next, a ground conductive layer 15 may be formed above one surface (first surface 11a) of the glass substrate 11 formed with the hole 13, and on an inner wall of the hole 13 (FIG. 3B). The ground conductive layer 15 is formed in at least a side wall within the hole 13 and may also be further formed on a bottom part of the hole 13.

The ground conductive layer 15 can be formed by a vapor deposition method or sputtering method and the like. Such a ground conductive layer 15 can be provided with a single layer structure of copper, nickel, titanium, chrome or tungsten and the like or a multi-layer structure of a combination of two of more of these (for example, titanium/copper, titanium/nickel). The thickness of the ground conductive layer 15 can be set to around 10~1000 nm for example.

Next, a through electrode 17 is formed by filling a conductive material (copper (Cu) or copper alloy etc.) comprised from a metal material into the hole 13 using an electrolytic plating method and the like with the ground conductive layer 15 as a power feed layer (FIG. 3C). In the electrolytic plating method, since a conductive material is deposited above the ground conductive layer 15 and a conductive material is also deposited concentrated at an opening part with a high electric field density, the opening part is closed. In addition, the conductive material is deposited and grown from the closed part towards an inner direction of the hole 13, and the interior of the hole 13 becomes filled by the conductive material to form the through electrode 17. It is possible to use a sputtering method, an electro less plating method, a molten metal suction method, a printing method or CVD method and the like in addition to an electrolytic plating method for filling a conductive material such as copper (Cu) or a copper alloy and the like. However, the ground conductive layer 15 may be omitted in the case where a molten metal suction method, a printing method or CVD method are used as the filling method of a conductive material.

In this way, since the conductive material is deposited and grown from one direction within the hole 13 with the ground conductive layer 15 as a power feed layer to form the through electrode 17 in the present disclosure, at this stage it is possible to form the through electrode 17 within the hole 13 filled densely with the conductive material without producing any gaps.

Next, a support substrate 21 may be adhered via an adhesive 19 to the first surface 11a of a glass substrate formed with a through electrode (FIG. 3D). The support substrate 21 is used for making handling of a thin substrate easier after a thinning process is performed in a subsequent polishing process. Therefore, the thickness of the substrate is sufficient even after a thinning process by a subsequent polishing process, and it is not necessary to use the support substrate 21 in the case where there is no problem in handling. However, in the case where the support substrate 21 is not used, in order to prevent the first surface 11a of the glass substrate formed with a through electrode from corrosion and the like in a subsequent polishing process, it is necessary to adopt a polishing prevention means such as attaching a protective sheet to the first surface a of the glass substrate.

Following this, the glass substrate 11 is thinned by polishing the second surface 11b side of the glass substrate 11 (FIG. 4A). Specifically, the second surface 11b side of the glass substrate 11 is immersed in a chemical polishing solution including hydrofluoric acid and chemical polishing for thinning the glass substrate is performed by dissolving the outer top surface of the glass substrate (slimming).

In addition, as a thinning process of the glass substrate 11, in addition to slimming described above, the glass substrate 11 may be thinned by performing a polishing process such as chemical mechanical polishing (CMP) from the second surface 11b side of the glass substrate 11.

Apart from a thinning process of the glass substrate 11 described above, a polishing process such as CMP may also be further performed, and thereby any surplus conductive material or ground conductive layer 15 is removed by polishing, the through hole 13a is formed and the through electrode 17 formed inside the through hole 13a is exposed.

Since it is particularly easy for the transformed part transformed in the glass processing step described previously to be etched in this polishing process, after any surplus conductive material or ground conductive layer 15 is removed, the vicinity of the second surface 11b of the glass substrate contacting an outer rim of the through electrode becomes depressed by polishing, and it is possible to form the depression part 25 in at least one part of the through hole 13a having a shape in which the hole size of the through hole 13a gradually increases as it approaches the second surface. Furthermore, since the through electrode 17 arranged inside the depression part 25 has a slower etching rate compared to the transformed part of the glass substrate, it is more difficult to be etched than the glass substrate 11, and the projection part 17a of the through electrode takes on a shape which projects from the second surface 11b of the glass substrate 11 (FIG. 4A).

Furthermore, in relation to a polishing process of the second surface 11b side of the glass substrate 11, although an illustration of the ground conductive layer 15 at the tip of the projection part 17a is omitted after FIG. 4A, in the case where only slimming is performed as a polishing process of the second surface 11b side, the ground conductive layer 15 at the tip of the projection part 17a remains without being polished.

In addition, in the case where the length of the through electrode becomes non-uniform due to non-uniformity of a hole opening process, first polishing is carried out using CMP until the length of all the through electrodes is aligned with the length of the shortest through electrode in order to make the length of the through electrode uniform and subsequently a slimming process may be performed to form a projection part of the through electrode.

Next, the support substrate 21 and adhesive 19 adhered to the first surface 11a side of the glass substrate 11 are removed by peeling (FIG. 4B), and any surplus ground conductive layer 15 formed above the first surface is removed by polishing and etching (FIG. 4C). Any method may be used in this process as long as it is possible to remove the surplus ground conductive layer 15 formed above the first surface 11a of the glass substrate 11. Specifically, the first surface 11a and second surface 11b of the glass substrate 11 may be etched together, and only the first surface 11a may be etched after forming a protection layer on the second surface 11b in order to prevent the second surface 11b side from being etched. In the case where etching is performed without forming a protection layer on the second surface 11b, unlike FIG. 4C the ground conductive layer 15 formed on the side wall of the projection part 17a and exposed to the second surface 11b side is removed by etching.

In this way, it is possible to form the conductive material filled through hole substrate 10 related to the first embodiment of the present disclosure.

Furthermore, an insulation layer 31 may be formed, the insulation layer 31 filling a gap between the glass substrate 11 and the through electrode 17, contacting the projection part 17a on the second surface 11b side of the conductive material filled through hole substrate 10 (FIG. 4D). The insulation layer 31 may be formed by a resin material such as polyimide. The insulation layer 31 may be any insulation layer as long as it performs a gas discharge function. The insulation layer 31 is arranged in order to discharge gas discharged from the interior of the through electrode 17 described above to the exterior. That is, the insulation layer 31 is arranged as a gas discharge part.

In addition, the insulation layer 31 may also be an inorganic insulation layer such as a silicon oxide film or silicon nitride film and the like. In this case, the insulation layer 31 is covered by the inorganic insulation layer after gas is discharged. Thereby, it is possible to maintain a gas discharged state.

As a formation method of the insulation layer 31, a resin with insulation properties may be patterned at the periphery of the through electrode 17 using photolithography and a heat treatment (200° C. or more) is performed. In this case, it is important that the insulation layer 31 is formed to cover at least a section of a boundary between the ground conductive layer 15 and through electrode 17 in the second surface 11b, and cover an area smaller than an area where the through electrode 17 is exposed above the second surface 11b. That is, it has been found that gas which is discharged from the interior of the through electrode 17 in the annealing process (heat treatment) described above is discharged from a slight gap formed at the boundary between the ground conductive layer 15 and through electrode 17 after a resist for plate formation is removed by a chemical process using an organic solvent. This point is explained further herein. Furthermore, the insulation layer 31 may be any insulation layer as long as it performs a gas discharge function. For example, a photosensitive or non-photosensitive polyimide may be used as the insulation layer 31. However, a patterning process is necessary after formation of the insulation layer 31 in the case where a non-photosensitive polyimide is used.

In addition, in the case where the insulation layer 31 is formed from an inorganic insulation material such as an oxide film or nitride film, since the oxide film or nitride film itself is a material which does not discharge gas discharged from the interior of the through electrode 17 in the annealing process (heat treatment) described above (barrier film against those gases), it is necessary to form the insulation layer 31 after sufficiently performing a heat treatment and discharging any gas after removing a resist for plate formation by a chemical process using an organic solvent.

Here, the gas discharge effects in the present disclosure are described in detail. In a through electrode substrate formed by a conventional manufacturing method, it has been confirmed that gases (water ($H_2O$) or hydrogen ($H_2$) etc.) which remain in a metal material such as copper (Cu) filled as a through electrode as described above is discharged in an annealing process. In addition, it has been confirmed that gas such as water ($H_2O$) or hydrogen ($H_2$) is discharged from a slight gap produced at a boundary of an outer rim of the through electrode. Gas such as water ($H_2O$) or hydrogen ($H_2$) discharged from the interior of a through electrode collects in a gap produced at this boundary which produces defects such as boost or blow-off phenomenon of a wiring layer formed on the through electrode substrate.

As another cause of this gas, a resist material component remains when forming filler plating or a resist peeling solution component remains when removing a resist for plate formation after filling, or a slimming solution component remains in the gap when performing a slimming process (exposing the through electrode). That is, when a substrate is immersed in a processing solution during the wet process described above, a considerable amount of the solution remains in the gap and a lengthy heat treatment is then required in order to completely remove the solution.

On the other hand, after a substrate is completed and used as a product, when water component gradually enters into the substrate (in particular the gap between the ground conductive layer 15 and through electrode 17) due to the surrounding environment (moisture and the like) and when heat is rapidly added, the amount of water discharge becomes instantaneously large to over usual amount of water discharge which leads to defects such as boost or blow-off phenomenon of a wiring layer formed on the through electrode substrate.

Since the conductive material filled through hole substrate 10 related to the first embodiment includes the depression part 25 at the periphery of the projection part 17a of the through electrode 17 and the depression part 25 keeps a gap 23 with the through electrode 17, it is possible to effectively discharge a gas component or water component produced from a conductive material during a heat treatment from the gap 23 to the exterior.

In addition, in the conductive material filled through hole substrate 10 related to the first embodiment, in the case an insulation layer 31 is formed on the second surface 11b side, the insulation layer 31 filling a gap between the glass substrate 11 and through electrode 17, contacting the projection part 17a on the second surface 11b side, since the insulation layer 31 has a larger molecular structure than the molecules of gas (water ($H_2O$) or hydrogen ($H_2$)) discharged from the interior of the through electrode 17, it is possible to discharge the gas to the exterior. Therefore, gas (water ($H_2O$) or hydrogen ($H_2$)) which is discharged from the interior of the through electrode 17 in an annealing process passes through the insulation layer 31 and is discharged to the exterior. Furthermore, it is sufficient that an area of the insulation layer 31 which covers the through electrode 17 exposed above the second surface 11b of the glass substrate 11 is about 20%~80% for example with respect to the entire exposed surface of the through electrode 17. In addition, the thickness of the insulation layer 31 is about 1~20 μm, preferably around 3~8 μm. There is no particular limitation to each value of the contact area and thickness of the insulation layer 31 and may be any value as long as the gas discharge effect described above is performed.

As described above, in the conductive material filled through hole substrate 10 shown in the first embodiment, it is possible to discharge gas discharged from the interior of the through electrode 17 formed by filling a metal material (copper (Cu) etc.) into the through hole 13a formed in the glass substrate 11 to the exterior via the gap 23 or insulation layer 31. As a result, it is possible to prevent a blow-off, peeling or blister phenomenon or cracks from occurring in an electrode pad, increase yield when manufacturing a substrate and improve reliability.

Furthermore, by providing the conductive material filled through hole substrate 10 related to the first embodiment of the present disclosure with the projection part 17a of a through electrode and the depression part 25 in a periphery thereof, other components become structurally stable when such components are formed above the through electrode 17 and it is possible to prevent horizontal misalignment or desorption.

Although a structure and manufacturing method of a conductive material filled through hole substrate related to the first embodiment of the present disclosure was explained above, the embodiment described above is an example and the present disclosure is not limited to the embodiment described above.

Second Embodiment

In the second embodiment, an example of an electronic circuit substrate is explained in which the conductive material filled through hole substrate 10 which is the structural body shown in the first embodiment described above is used as an interposer.

Figure 5:
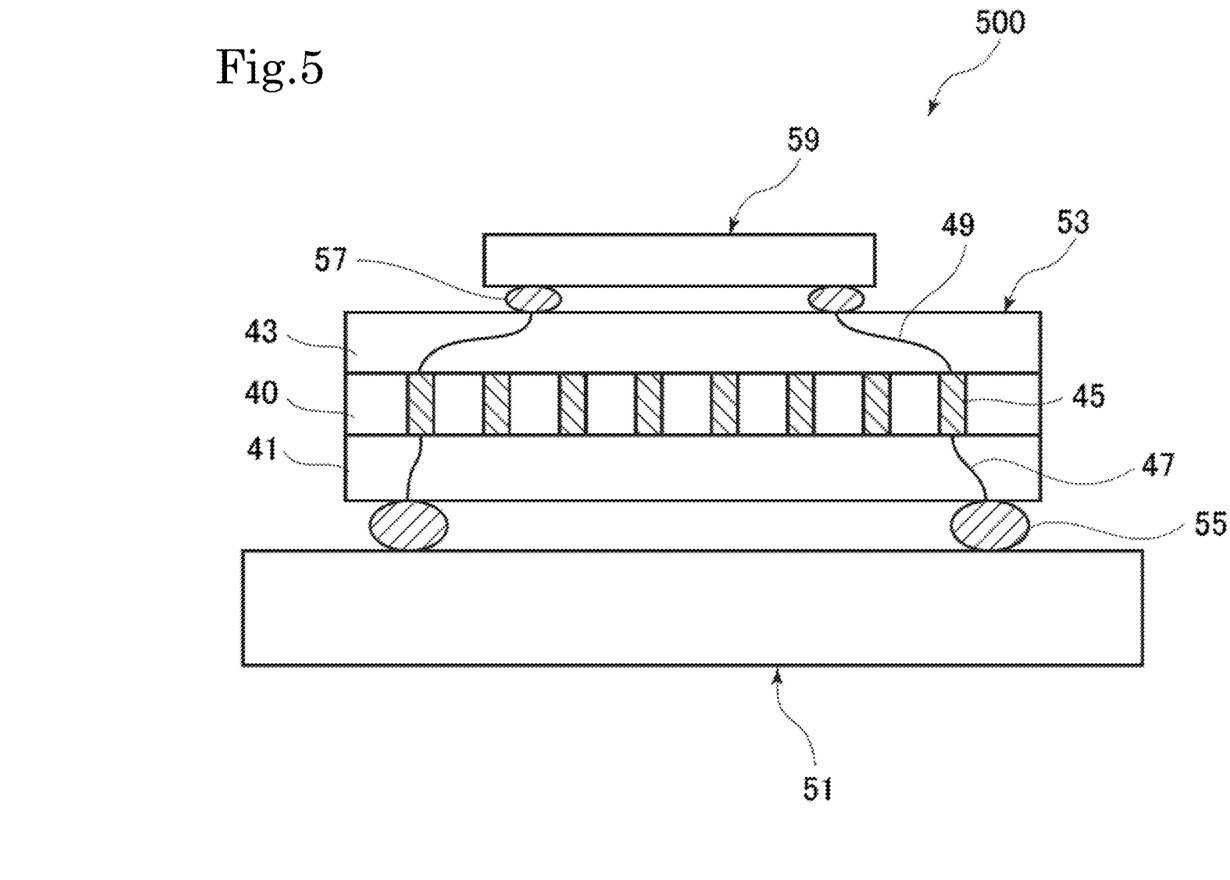
FIG. 5 is a diagram showing a structure of an electronic circuit substrate using the conductive material filled through hole substrate related to a first embodiment as an interposer.

FIG. 5 is a diagram showing a structure of an electronic circuit substrate 500 in which the conductive material filled through hole substrate 10 shown in the first embodiment described above is used as an interposer. In FIG. 5, the electronic circuit substrate 500 is arranged with a printed circuit substrate 51, and a chip substrate 53 comprised from a lower layer substrate 41, an interposer 40 and an upper layer substrate 43. A plurality of solder balls 55 are formed in the upper surface of the printed circuit substrate 51, and the printed circuit substrate 51 and chip substrate 53 are electrically connected via the plurality of solder balls 55. A plurality of solder balls 57 are formed in the upper surface of the chip substrate 53, and the chip substrate 53 and an IC chip 59 are electrically connected via the plurality of solder balls 57.

Lower layer wiring 47 is formed in the lower layer substrate 41 to electrically connect the solder ball 55 and a through electrode 45 of the interposer 40. The lower layer wiring 47 is formed aligned with the formation position of the solder ball 55 and the formation position of the through electrode 45 of the interposer 40. Upper layer wiring 49 is formed in the upper layer substrate 43 to electrically connect the solder ball 57 and through electrode 45 of the interposer 40. The upper layer wiring 49 is formed aligned with the formation position the through electrode 45 of the interposer 40 and the formation position of the solder ball 57.

The interposer 40 is electrically connected with the lower layer wiring 47 formed in the lower layer substrate 41 and with the upper layer wiring 49 formed in the upper layer substrate 43 via a plurality of through electrodes 45. As is shown in FIG. 5, it is possible to mount the IC chip 59 at high density using the chip substrate 53 without changing the wiring pattern (not shown in the diagram) of the printed circuit substrate 51 by applying the interposer 40 within the chip substrate 53.

As described above, it is possible to mount the IC chip 59 at high density above the printed circuit substrate 51 by configuring the electronic circuit substrate 500 using the conductive material filled through hole substrate 10 as the interposer 40. Therefore, it is possible to contribute to the miniaturization of an electronic device by applying such an electronic circuit substrate 500 to electronic devices.

Furthermore, although an example was illustrated in the second embodiment using the conductive material filled through hole substrate 10 as the interposer 40 of the electronic circuit substrate 500, the present disclosure is not limited to this example and can be applied to mobile phones, computers and various electronic devices which are to be mounted at high density.

Third Embodiment

Figure 7:
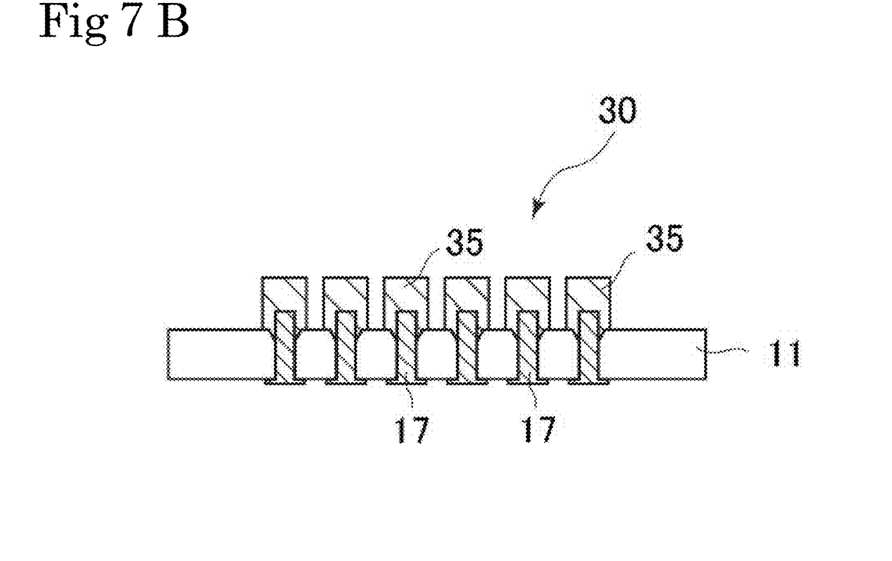
FIG. 7A is an upper surface diagram of a probe card related to a third embodiment of the present disclosure.
FIG. 7B is a cross-sectional diagram of a probe card related to a third embodiment of the present disclosure.
Figure 7A:
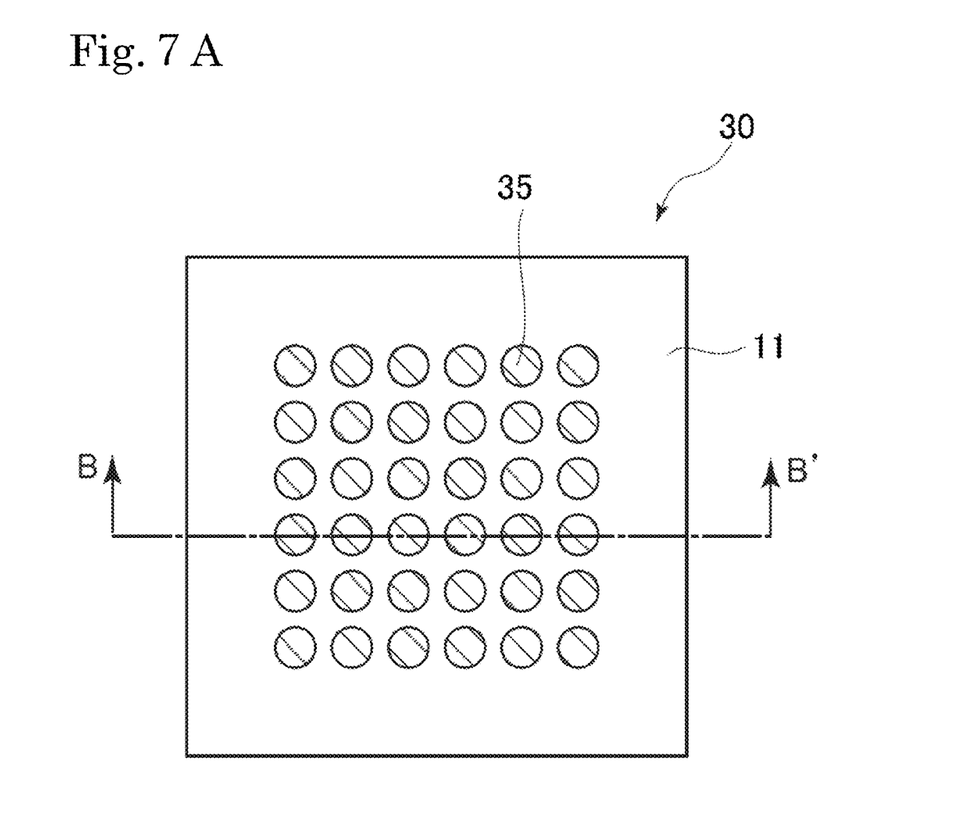

A conductive material filled through hole substrate which is a structural body related to the third embodiment of the present disclosure is explained while referring to FIG. 7A and FIG. 7B. FIG. 7A and FIG. 7B are an upper surface diagram and cross-sectional diagram of a probe card for an IC tester related to the third embodiment of the present disclosure.

It can be seen from FIG. 7A and FIG. 7B that a plurality of probes 35 including elasticity protrude from an upper surface of a probe card 30 (second surface 11b of substrate 11).

Figure 4:
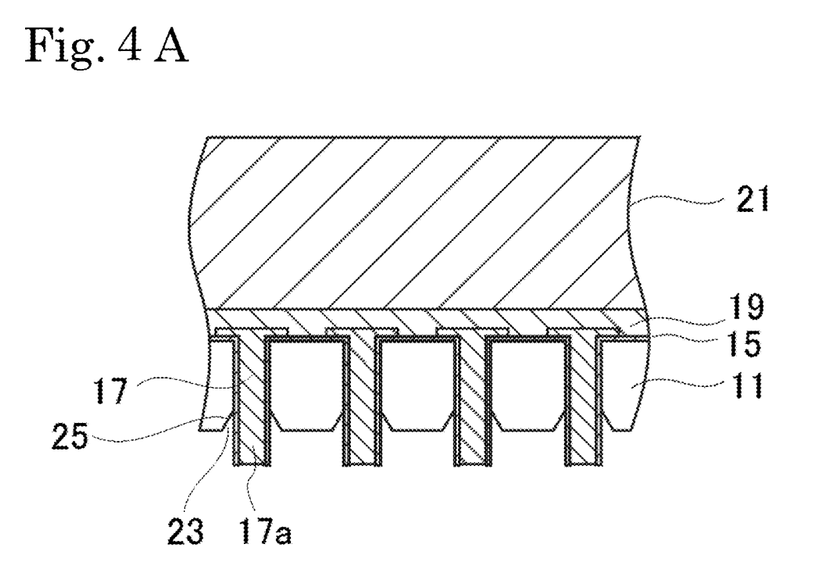
FIG. 4A is a process diagram showing a manufacturing method of a conductive material filled through hole substrate related to a first embodiment of the present disclosure.
FIG. 4B is a process diagram showing a manufacturing method of a conductive material filled through hole substrate related to a first embodiment of the present disclosure.
FIG. 4C is a process diagram showing a manufacturing method of a conductive material filled through hole substrate related to a first embodiment of the present disclosure.
FIG. 4D is a process diagram showing a manufacturing method of a conductive material filled through hole substrate related to a first embodiment of the present disclosure.

Although the probe card 30 shown in FIG. 7A and FIG. 7B is formed by the same manufacturing method from FIG. 3A to FIG. 4C, after the process in FIG. 4C, the structural body is different to that shown in FIG. 1 and FIG. 2 in that a gap between the glass substrate 11 and through electrode 17 is filled with a column shaped conductive member 33 on the second surface 11b side of the glass substrate 11 to cover the ground conductive layer 15 and an area where the through electrode 17 is exposed above the second surface 11b.

Figure 6A:
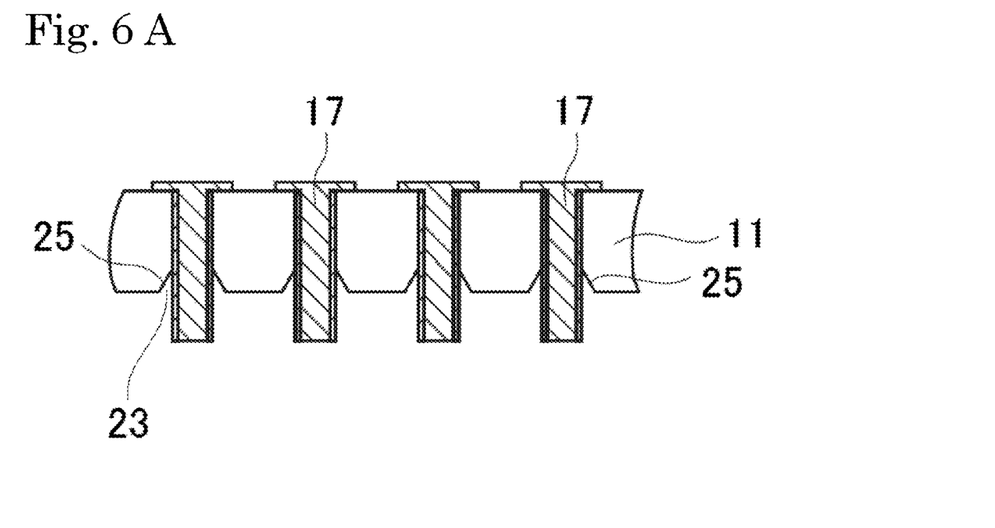
FIG. 6A is a process diagram showing a manufacturing method of a probe card related to a third embodiment of the present disclosure.
Figure 6B:
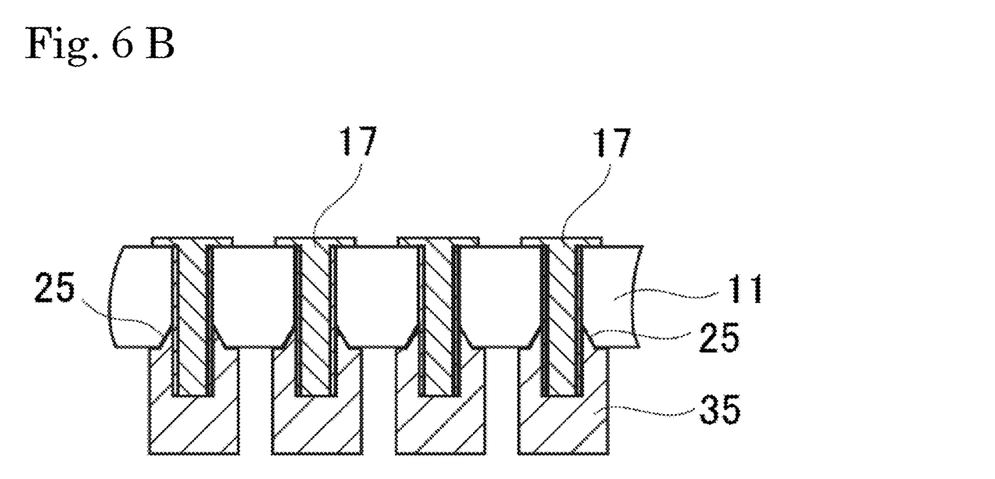
FIG. 6B is a process diagram showing a manufacturing method of a probe card related to a third embodiment of the present disclosure.

A manufacturing method of the probe card 30 related to the third embodiment of the present disclosure is explained while referring to FIG. 6A and FIG. 6B. FIG. 6A and FIG. 6B are process diagrams showing a manufacturing method of the probe card 30 related to the third embodiment of the present disclosure.

First, the probe card 30 shown in FIG. 7A and FIG. 7B is formed by the same manufacturing method from FIG. 3A to FIG. 4C (FIG. 6A). In the process in FIG. 6A, a gap between the glass substrate 11 and through electrode 17 is filled with a column shaped conductive member 33 on the second surface 11b side of the glass substrate 11 to cover the ground conductive layer 15 and an area where the through electrode 17 is exposed above the second surface 11b (FIG. 6B).

This conductive member 33 may also include elasticity.

In the case where the conductive member 33 is formed as the probe 35 including elasticity, the probe card 30 related to the third embodiment of the present disclosure can be utilized as a probe card for use in a function test (wafer test) performed before cutting a wafer into individual LSI chips in a state where multiple LSI chips are formed above the wafer.

In the case where the conductive member 33 of the present disclosure is used as this type of probe 35, the through electrode 17 exposed to a surface (first surface 11a) on the opposite side of a surface formed with the column shaped conductive member 33 functioning as the probe 35 is adhered to a bump of another component such as an interposer, and it is possible to contact the tip of the column shaped conductive member 33 formed on the second surface 11b side with a terminal of an examination chip and measure the electrical properties of the examination chip.

According to the probe card 30 related to the present embodiment, by providing the projection part 17a of the through electrode and the depression part 25 in a periphery therein, the conductive member 33 formed above the through electrode 17 is structurally stable and it is possible to prevent horizontal misalignment or desorption of the conductive member 33.

Furthermore, the present disclosure is not limited to the embodiments described above and can be appropriately modified in a range that does not depart from the scope and spirit of the disclosure.

The present disclosure is useful in the manufacture of various wiring substrates, multi-layer wiring substrates and electronic devices and the like.

The invention claimed is:

1. A structural body comprising:
    a substrate having insulation properties arranged with a first surface and a second surface opposing the first surface;
    a through hole passing through the first surface and the second surface of the substrate; and
    a through electrode including a conductive material arranged within the through hole, the through electrode conducting the first surface and the second surface of the substrate and including a projection part exposed from the second surface to the outside of the through hole;
    wherein
    at least a part of the through hole is gradually increasing in the hole size approaching the second surface in a thickness direction of the substrate, and forming a depression part keeping a gap between the through hole and the through electrode.

2. The structural body according to claim 1, further comprising:
    a gas discharge part arranged to fill the gap and contact the projection part, the gas discharge part discharging gas discharged from the interior of the through electrode to the exterior.

3. The structural body according to claim 2, further comprising:
    a ground conductive layer arranged on an inner wall of the through hole and including a conductive material, the gas discharge part covering a part of a boundary between the ground conductive layer and the through electrode at the second surface, and covering a smaller area than an area of the through electrode exposed above the second surface.

4. The structural body according to claim 2, wherein the gas discharge part includes an insulation material.

5. The structural body according to claim 3, wherein the gas discharge part includes an insulation material.

6. The structural body according to claim 4, wherein the gas discharge part includes an insulation resin.

7. The structural body according to claim 5, wherein the gas discharge part includes an insulation resin.

8. The structural body according to claim 6, wherein the gas discharge part includes a polyimide resin.

9. The structural body according to claim 7, wherein the gas discharge part includes a polyimide resin.

10. The structural body according to claim 1, further comprising:
a column shaped conductive member filling the gap, protruding from the second surface, and covering a region of the through electrode exposed above the second surface.

11. A method of manufacturing a structural body comprising:
forming a hole having one side open in a first surface of a substrate having insulation properties arranged with a second surface opposing the first surface;
forming a through electrode including a conductive material within the hole, the through electrode conducting the first surface and the second surface; and
performing a thinning process from the second surface side to expose a projection part of the through electrode from the second surface;
wherein
performing a thinning process includes a step at least a part of the hole gradually increasing in the hole size approaching the second surface in a thickness direction of the substrate, and forming a depression part keeping a gap between the hole and the through electrode.

12. The method of manufacturing a structural body according to claim 11, further comprising:
forming a gas discharge part to fill the gap and contact the projection part of the through electrode, the gas discharge part discharging gas discharged from the interior of the through electrode to the exterior.

13. The method of manufacturing a structural body according to claim 12, further comprising:
forming a ground conductive layer including a conductive material and covering an inner wall and above the first surface, the gas discharge part covering a part of a boundary between the ground conductive layer and the through electrode at the second surface, and covering a smaller area than an area of the through electrode exposed above the second surface.

14. The method of manufacturing a structural body according to claim 12, wherein the gas discharge part includes an insulation material.

15. The method of manufacturing a structural body according to claim 13, wherein the gas discharge part includes an insulation material.

16. The method of manufacturing a structural body according to claim 14, wherein the gas discharge part includes a polyimide resin.

17. The method of manufacturing a structural body according to claim 15, wherein the gas discharge part includes a polyimide resin.

18. The method of manufacturing a structural body according to claim 11, further comprising:
a column shaped conductive member filling the gap, protruding from the second surface, and covering a region of the through electrode exposed above the second surface.

* * * * *